(12) United States Patent
Jezewski et al.

(10) Patent No.: US 11,094,587 B2
(45) Date of Patent: Aug. 17, 2021

(54) USE OF NOBLE METALS IN THE FORMATION OF CONDUCTIVE CONNECTORS

(71) Applicant: Intel Corporation, Santa Clara, CA (US)

(72) Inventors: Christopher J. Jezewski, Hillsboro, OR (US); Srijit Mukherjee, Hillsboro, OR (US); Daniel B. Bergstrom, Lake Oswego, OR (US); Tejaswi K. Indukuri, Portland, OR (US); Flavio Griggio, Portland, OR (US); Ramanan V. Chebiam, Hillsboro, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/570,857

(22) PCT Filed: Jun. 3, 2015

(86) PCT No.: PCT/US2015/033930
§ 371 (c)(1),
(2) Date: Oct. 31, 2017

(87) PCT Pub. No.: WO2016/195672
PCT Pub. Date: Dec. 8, 2016

(65) Prior Publication Data
US 2018/0151423 A1 May 31, 2018

(51) Int. Cl.
*H01L 23/48* (2006.01)
*H01L 21/4763* (2006.01)
(Continued)

(52) U.S. Cl.
CPC .. *H01L 21/76846* (2013.01); *H01L 21/76802* (2013.01); *H01L 21/76805* (2013.01);
(Continued)

(58) Field of Classification Search
CPC ......... H01L 21/76807; H01L 21/76846; H01L 21/76843; H01L 23/53252;
(Continued)

(56) References Cited

U.S. PATENT DOCUMENTS

| 5,969,422 A | 10/1999 | Ting et al. |
| 7,405,154 B2 | 7/2008 | Cabral, Jr. et al. |

(Continued)

FOREIGN PATENT DOCUMENTS

| CN | 1783478 | 6/2006 |
| CN | 101395720 | 3/2009 |

(Continued)

OTHER PUBLICATIONS

International Search Report and Written Opinion for International Patent Application No. PCT/US15/33930, dated Mar. 3, 2016.
(Continued)

*Primary Examiner* — Alonzo Chambliss
(74) *Attorney, Agent, or Firm* — Green, Howard & Mughal LLP

(57) ABSTRACT

In one embodiment, a conductive connector for a microelectronic component may be formed with a noble metal layer, acting as an adhesion/wetting layer, disposed between a barrier liner and a conductive fill material. In a further embodiment, the conductive connector may have a noble metal conductive fill material disposed directly on the barrier liner. The use of a noble metal as an adhesion/wetting layer or as a conductive fill material may improve gapfill and adhesion, which may result in the conductive connector being substantially free of voids, thereby improving the
(Continued)

electrical performance of the conductive connector relative to conductive connectors without a noble metal as the adhesion/wetting layer or the conductive fill material.

7 Claims, 6 Drawing Sheets

(51) Int. Cl.
    *H01L 21/44*     (2006.01)
    *H01L 21/768*     (2006.01)
    *H01L 23/532*     (2006.01)
    *H01L 23/528*     (2006.01)
    *H01L 23/522*     (2006.01)

(52) U.S. Cl.
    CPC .. *H01L 21/76807* (2013.01); *H01L 21/76843* (2013.01); *H01L 21/76852* (2013.01); *H01L 21/76877* (2013.01); *H01L 23/528* (2013.01); *H01L 23/53209* (2013.01); *H01L 23/53238* (2013.01); *H01L 23/53252* (2013.01); *H01L 23/53266* (2013.01); *H01L 23/5226* (2013.01)

(58) Field of Classification Search
    CPC ......... H01L 23/53266; H01L 21/76852; H01L 21/76802; H01L 21/76877; H01L 21/76805; H01L 23/5226
    See application file for complete search history.

(56) References Cited

U.S. PATENT DOCUMENTS

| | | | |
|---|---|---|---|
| 7,470,617 B2* | 12/2008 | Chebiam | H01L 21/288 |
| | | | 257/E21.174 |
| 8,242,600 B2 | 8/2012 | Yang et al. | |
| 8,691,687 B2 | 4/2014 | Kelly et al. | |
| 9,406,615 B2* | 8/2016 | Jezewski | H01L 23/5329 |
| 2006/0113675 A1 | 6/2006 | Chang et al. | |
| 2007/0205510 A1 | 9/2007 | Lavoie et al. | |
| 2007/0222043 A1 | 9/2007 | Watanabe et al. | |
| 2008/0213994 A1* | 9/2008 | Chebiam | H01L 21/288 |
| | | | 438/643 |
| 2008/0280432 A1 | 11/2008 | Chang et al. | |
| 2008/0296768 A1* | 12/2008 | Chebiam | H01L 21/76846 |
| | | | 257/751 |
| 2009/0014878 A1 | 1/2009 | Cabral, Jr. et al. | |
| 2009/0169760 A1 | 7/2009 | Akolkar et al. | |
| 2009/0212433 A1 | 8/2009 | Yang et al. | |
| 2010/0078815 A1 | 4/2010 | Wang et al. | |
| 2010/0164108 A1 | 7/2010 | Johnston et al. | |
| 2010/0200991 A1* | 8/2010 | Akolkar | C23C 16/045 |
| | | | 257/751 |
| 2013/0017688 A1* | 1/2013 | Dubois | H01L 21/76826 |
| | | | 438/759 |
| 2014/0061918 A1* | 3/2014 | Jezewski | H01L 21/2855 |
| | | | 257/751 |
| 2014/0070327 A1* | 3/2014 | Niimi | H01L 27/0922 |
| | | | 257/369 |
| 2014/0183738 A1 | 7/2014 | Jezewski et al. | |
| 2014/0209984 A1* | 7/2014 | Liang | H01L 23/53266 |
| | | | 257/288 |
| 2015/0041854 A1* | 2/2015 | Wang | H01L 29/0653 |
| | | | 257/190 |
| 2015/0179508 A1* | 6/2015 | Adhiprakasha | H01L 23/53238 |
| | | | 257/751 |
| 2015/0179578 A1* | 6/2015 | Jezewski | H01L 21/31144 |
| | | | 257/768 |

FOREIGN PATENT DOCUMENTS

| | | |
|---|---|---|
| EP | 2779224 | 9/2014 |
| JP | 2007266083 | 10/2007 |
| TW | 201108379 | 3/2011 |

OTHER PUBLICATIONS

Extended European Search Report dated Nov. 19, 2018 for EP Patent Application No. 15894444.7.
Office Action and Search Report dated Jan. 8, 2019 for Taiwan Patent Application No. 105112952.
Final Office Action from Taiwan Patent Application No. 105112952 dated Nov. 19, 2019, 50 pgs.
Office Action from Korean Patent Application No. 10-2017-7031636 dated Feb. 25, 2020, 12 pgs.
Office Action from European Patent Application No. 15894444.7 dated Oct. 23, 2020, 7 pgs.
Office Action from Korean Patent Application No. 10-2017-7031636 dated Oct. 14, 2020, 8 pgs.
Office Action from Taiwan Patent Application No. 105112952 dated Aug. 7, 2020, 36 pgs.
Office Action from Korean Patent Application No. 10-2020-7032826 dated Dec. 18, 2020, 6 pgs.
Office Action from Chinese Patent Application No. 15/570,857 notified Apr. 1, 2021, 20 pgs.

* cited by examiner

USE OF NOBLE METALS IN THE FORMATION OF CONDUCTIVE CONNECTORS

CLAIM OF PRIORITY

This Application is a National Stage Entry of, and claims priority to, PCT Application No. PCT/US15/33930, filed on 3 Jun. 2015 and titled "THE USE OF NOBLE METALS IN THE FORMATION OF CONDUCTIVE CONNECTORS", which is incorporated by reference in its entirety for all purposes.

TECHNICAL FIELD

Embodiments of the present description relate to the field of microelectronic devices, and, more particularly, to the fabricating microelectronic connectors, such as contact structure and conductive route structures, used in the formation of microelectronic devices.

BACKGROUND

The microelectronic industry is continually striving to produce ever faster and smaller microelectronic devices for use in various electronic products, including, but not limited to portable products, such as portable computers, digital cameras, electronic tablets, cellular phones, and the like. As the size of components, such as microelectronic dice and microelectronic substrates, are reduced, the size of conductive connectors, such as contact structures and conductive routes (conductive traces and conductive vias), must also be reduced. However, the reduction of the size of the conductive connectors may result high resistivity due to voids forming in the conductive connectors due to poor metal adhesion and/or poor gap filling. Such high resistivity may result in the electrical connectors being incapable of carrying effective electrical signals for the operation of the microelectronic devices. Therefore, there is a need to develop conductive connectors and methods of fabrication of the same which are capable of carrying effective electrical signals.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The present disclosure will be described with additional specificity and detail through use of the accompanying drawings, such that the advantages of the present disclosure can be more readily ascertained, in which:

DESCRIPTION OF EMBODIMENTS

Figure 1:
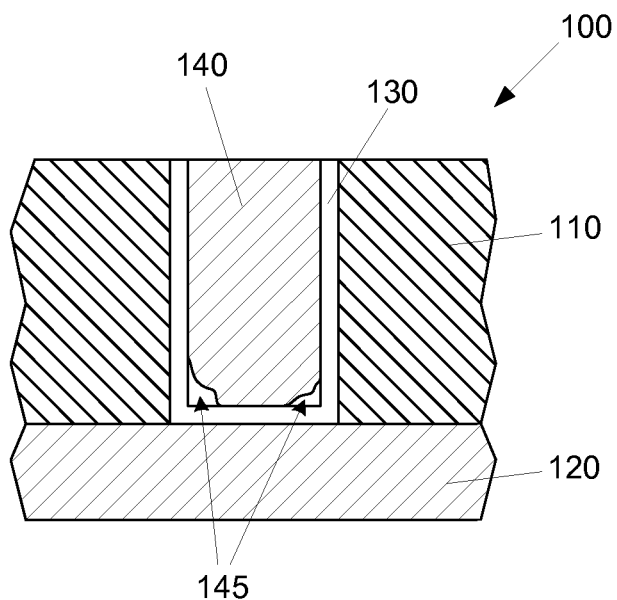
FIG. 1 illustrates side cross sectional views of a microelectronic connector, as known in the art.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer or component with respect to other layers or components. One layer/component "over" or "on" another layer/component or bonded "to" another layer/component may be directly in contact with the other layer/component or may have one or more intervening layers/components. One layer/component "between" layers/components may be directly in contact with the layers/components or may have one or more intervening layers/components.

Microelectronic devices are generally fabricated from various microelectronic components, including, but not limited to, at least one microelectronic die (such as a microprocessor, a chipset, a graphics device, a wireless device, a memory device, an application specific integrated circuit, or the like), at least one passive component (such as resistors, capacitors, inductors and the like), and at least one microelectronic substrate (such as interposers, motherboards, and the like) for mounting the components. Electrical signals, power delivery, and ground lines are provided through conductive connectors that may be formed in or on the microelectronic components. As will be understood to those skilled in the art, such conductive connectors may including contact structures (such as contact structures that deliver electrical signals to a gate electrode), conductive route structures (such as a plurality of conductive traces formed on layers of dielectric material that are connected by conductive vias) for the interconnection of various microelectronic components, or any other structures that may be used for electrical signals, power delivery, and/or ground lines.

FIG. 1 illustrates a portion of a microelectronic connector 100, as known in the art. The conductive connector 100 may extend through a dielectric material layer 110 to contact a conductive land 120. The conductive connector 100 may comprise a barrier liner 130 abutting the dielectric material layer 110 and the conductive land 120, and conductive fill material 140 abutting the barrier liner 130. However, the barrier liner 130 may not provide sufficient adhesion and wetting for the conductive fill material 140 such that at least one void 145 may form in the conductive connector 100. These voids 145 may increase the resistance of conductive connector 100 relative to a conductive connector having no voids.

Embodiments of the present description include a conductive connector that has a noble metal layer, acting as an adhesion/wetting layer, disposed between a barrier liner and a conductive fill material. In further embodiments of the present description, the conductive connector may have a noble metal conductive fill material disposed directly on the barrier liner. The use of a noble metal as an adhesion/wetting layer or as a conductive fill material may improve gapfill and adhesion, which may result in the conductive connector being substantially free of voids, thereby improving the electrical performance of the conductive connector relative to conductive connectors without a noble metal as the adhesion/wetting layer or the conductive fill material.

Figure 2:
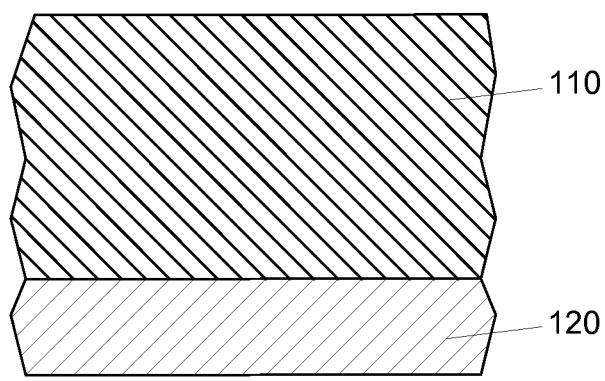
FIGS. 2-7 illustrate side cross sectional views of a method of forming a conductive connector, according to an embodiment of the present description.

FIGS. 2-6 illustrate a method of fabricating a conductive connector according to one embodiment of the present description. As shown in FIG. 2, the dielectric material layer 110 may be formed over the conductive land 120. The dielectric material layer 110 may be any appropriate dielectric material, including but not limited to, silicon dioxide ($SiO_2$), silicon oxynitride ($SiO_xN_y$), and silicon nitride ($Si_3N_4$) and silicon carbide (SiC), liquid crystal polymer, epoxy resin, bismaleimide triazine resin, polyimide materials, and the like, as well as low-k and ultra low-k dielectrics (dielectric constants less than about 3.6), including but not limited to carbon doped dielectrics, fluorine doped dielectrics, porous dielectrics, organic polymeric dielectrics, silicon based polymeric dielectrics, and the like. The dielectric material layer 110 may be formed by any known technique, including, but not limited, chemical vapor deposition, physical vapor deposition, coating, lamination, and the like.

It is understood that conductive land 120 could be any appropriate microelectronic structure. In one embodiment, the conductive land 120 may be a transistor structure, such as a transistor gate electrode. In such an embodiment, the conductive land 120 may be a workfunction metal, including, but not limited to, titanium, aluminum, tantalum, zirconium, and the like. In another embodiment, the conductive land 120 may be a part of a conductive route structure, such as a front end and/or back end metallization. In such an embodiment, the conductive land 120 may include, but is not limited to, copper, silver, nickel, gold, aluminum, tungsten, cobalt, and alloys thereof, and the like.

Figure 3:
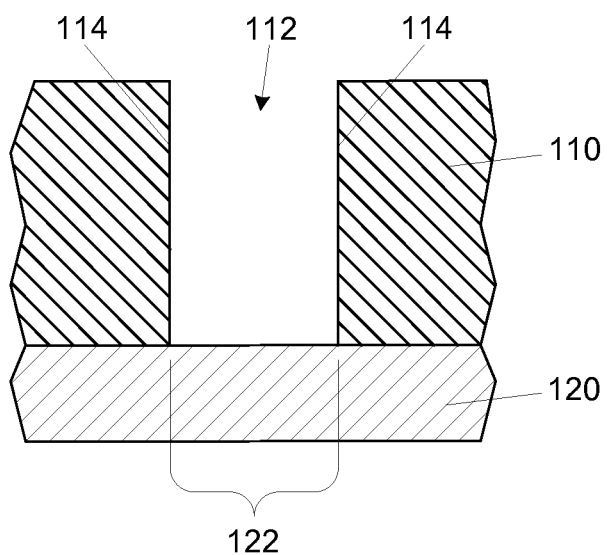

As shown in FIG. 3, at least one opening 112, such as a trench or a via, may be formed through the dielectric material layer 110 to expose a portion 122 of the conductive land 120. As will be understood to those skilled in the art, the opening 112 may be a part of and extend from a trench. The openings 112 may be formed by any known technique, such as photolithography, etching, and laser ablation.

Figure 4:
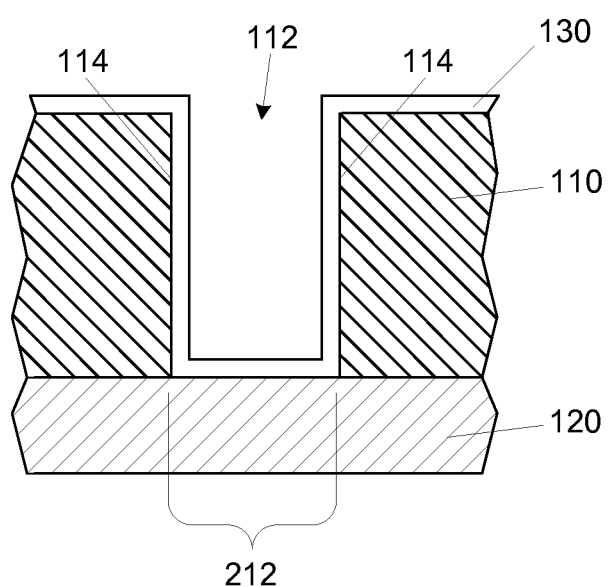

As shown in FIG. 4, the barrier liner 130 may be formed on sidewalls 114 of the opening 112, as well as on the exposed portion 122 of the conductive land 120. As will be understood to those skilled in the art, the barrier liner 130 may be used to prevent the material used to form the conductive fill material 140 from migrating into the adjacent dielectric material layer 110 and/or to serve as a nucleation layer for the subsequent deposition of the conductive fill material. The barrier liner 120 may be made of any appropriate material, including but not limited to, titanium, tantalum, tungsten, molybdenum, nitrides thereof, and the like. The barrier liner 120 may be formed by any known process, including but not limited to physical vapor deposition, chemical vapor deposition, atomic layer deposition, electroless plating, electroplating, and the like. In an embodiment of the present description, the barrier liner 120 may be formed by a conformal deposition process resulting in a substantially conformal barrier liner 120.

Figure 5:
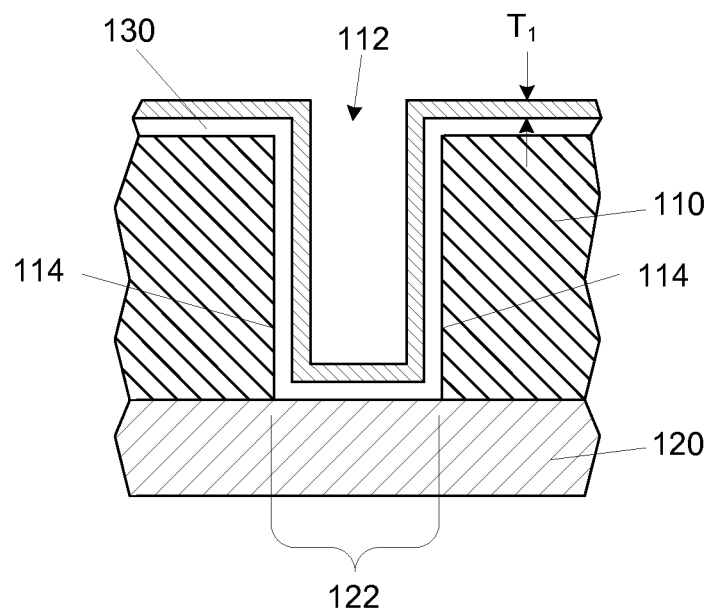

As shown in FIG. 5, a noble metal layer 150 may be formed on the barrier liner 130. In one embodiment, the noble metal layer 150 may comprise ruthenium, platinum, palladium, rhodium, rhenium, and iridium. In an embodiment, the noble metal layer 150 may be deposited by any known process, including but not limited to physical vapor deposition, chemical vapor deposition, atomic layer deposition, electroless plating, electroplating, and the like. In an embodiment of the present description, the noble metal layer 150 may be formed by a conformal deposition process resulting in a substantially conformal noble metal layer 150.

Figure 6:
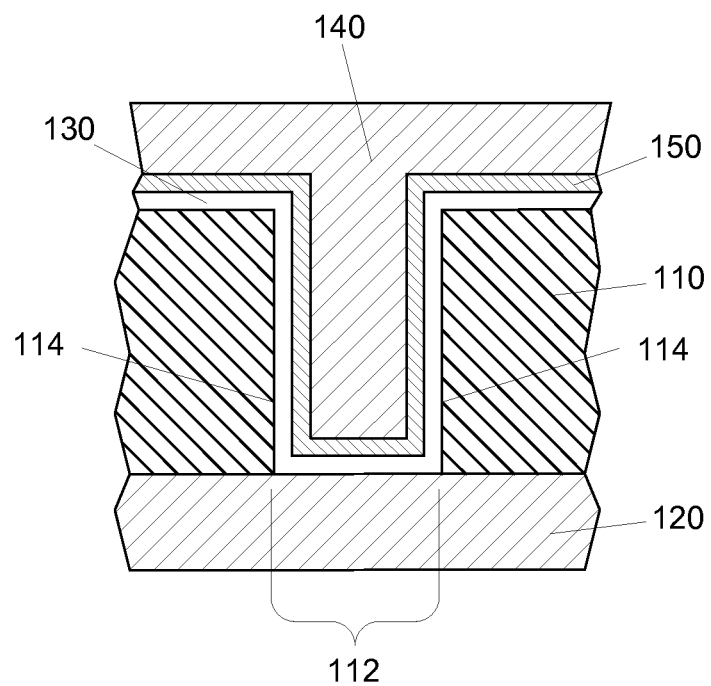

As shown in FIG. 6, the conductive fill material 140 may be deposited in the opening 112 to abut the noble metal layer 150. The conductive fill material 140 may be made of any appropriate conductive material, including but not limited to, metals, such as cobalt, ruthenium, platinum, palladium, rhenium, iridium, molybdenum, nickel, silicon, tungsten, silver, and alloys or components thereof, as well as their borides, carbides, silicides, and nitrides. In an embodiment, the conductive fill material 140 may be formed by any known process, including but not limited to physical vapor deposition, chemical vapor deposition, atomic layer deposition, electroless plating, electroplating, and the like.

Figure 7:
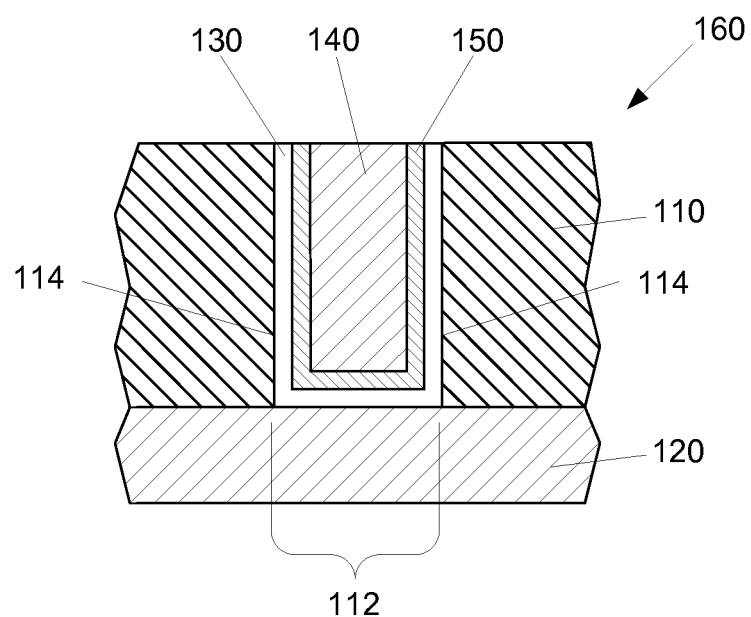

As shown in FIG. 7, any conductive fill material 140, noble metal layer 150, and barrier liner 130 which may extend over the dielectric material layer 110 outside of the opening 112 (see FIG. 2) may be removed, such as by chemical mechanical polishing, to form at least one conductive connector 160.

As shown in FIGS. 2-7, the embodiments of the present description may result in the formation of the conductive connector 160 being substantially void free. This is a result of the noble metal having high adhesion and wetting properties. Thus, the conductive fill material 140 will fill the opening 112 (see FIG. 2) and adhere to the noble metal layer 150. In a specific embodiment as shown in FIGS. 2-7, the conductive land 120 may comprise titanium, the barrier liner 130 may comprise titanium nitride, the noble metal layer 150 may comprise ruthenium that may be conformally deposited to a thickness $T_1$ (see FIG. 5) of between about 1 and 50 angstroms, and the conductive fill material 140 may be cobalt. It is understood that the air breaks may be formed between each of the metal layers, liners, materials, and lands.

Figure 8:
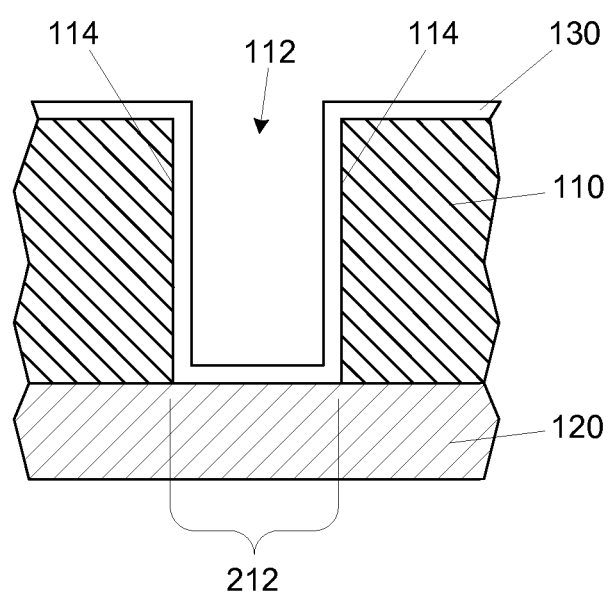
FIGS. 8-10 illustrate side cross sectional views of a method of forming a conductive connector, according to another embodiment of the present description.

In another embodiment of the present description, the conductive fill material 140 may be a noble metal, which would make the formation of the noble metal layer 150 of FIGS. 5-7 unnecessary. As shown in FIG. 8, the barrier liner 130 may be formed on sidewalls 114 of the opening 112, as well as on the exposed portion 122 of the conductive land 120, as discussed with regard to FIG. 4.

Figure 9:
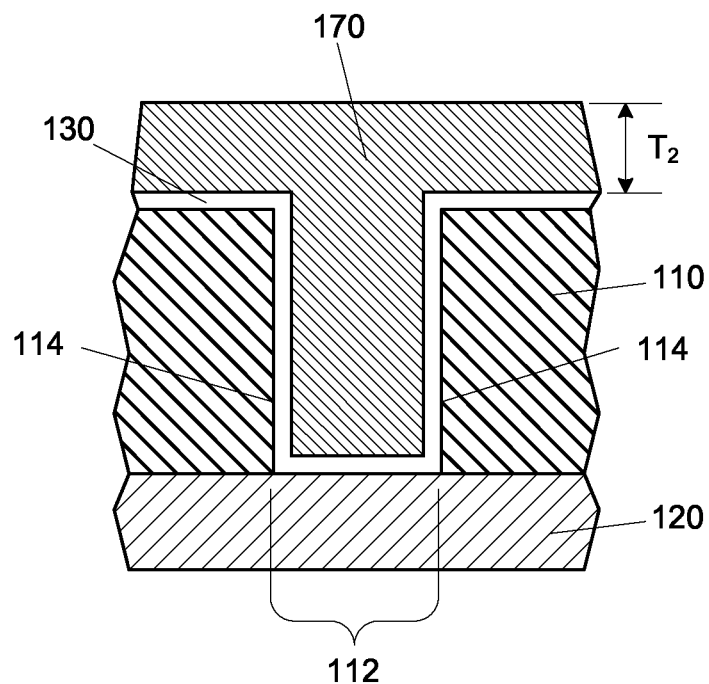

As shown in FIG. 9, a noble metal conductive fill material 170 may be deposited in the opening 112 to abut the barrier liner 130. The noble metal conductive fill material 170 may comprise ruthenium, platinum, palladium, rhodium, rhenium, and iridium.

Figure 10:
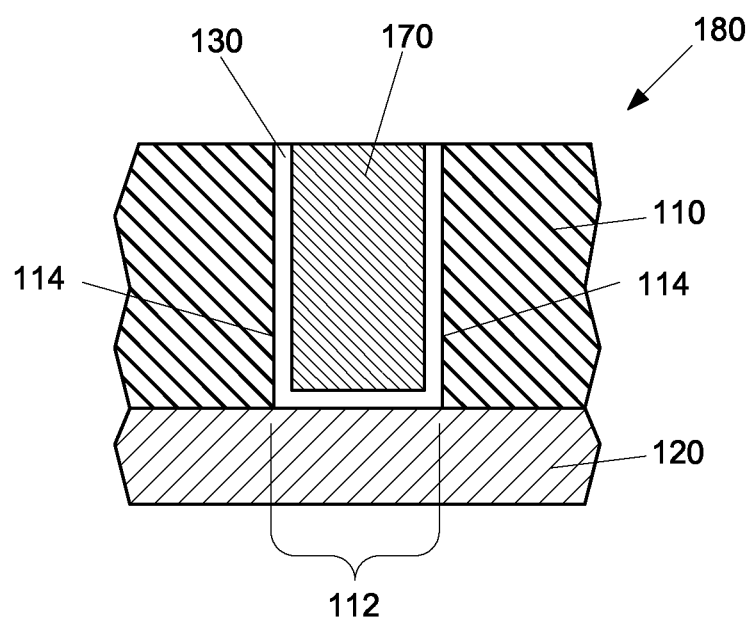

As shown in FIG. 10, any noble metal conductive fill material 170 and barrier liner 130 which may extend over the dielectric material layer 110 outside of the opening 112 (see FIG. 8) may be removed, such as by chemical mechanical polishing, to form at least one conductive connector 180.

As shown in FIGS. 8-10, the embodiments of the present description may result in the formation of the conductive connector 180 being substantially void free. This is a result of the noble metal having high adhesion and wetting properties, as previously discussed. In a specific embodiment as shown in FIGS. 8-10, the conductive land 120 may comprise titanium, the barrier liner 130 may comprise titanium nitride, and the noble metal conductive fill material 170 may comprise ruthenium that may be deposited with a fill process to a thickness $T_2$ (see FIG. 9) of between about 1 and 1000 angstroms. It is understood that the air breaks may be formed between each of the metal layers, liners, materials, and lands.

Figure 11:
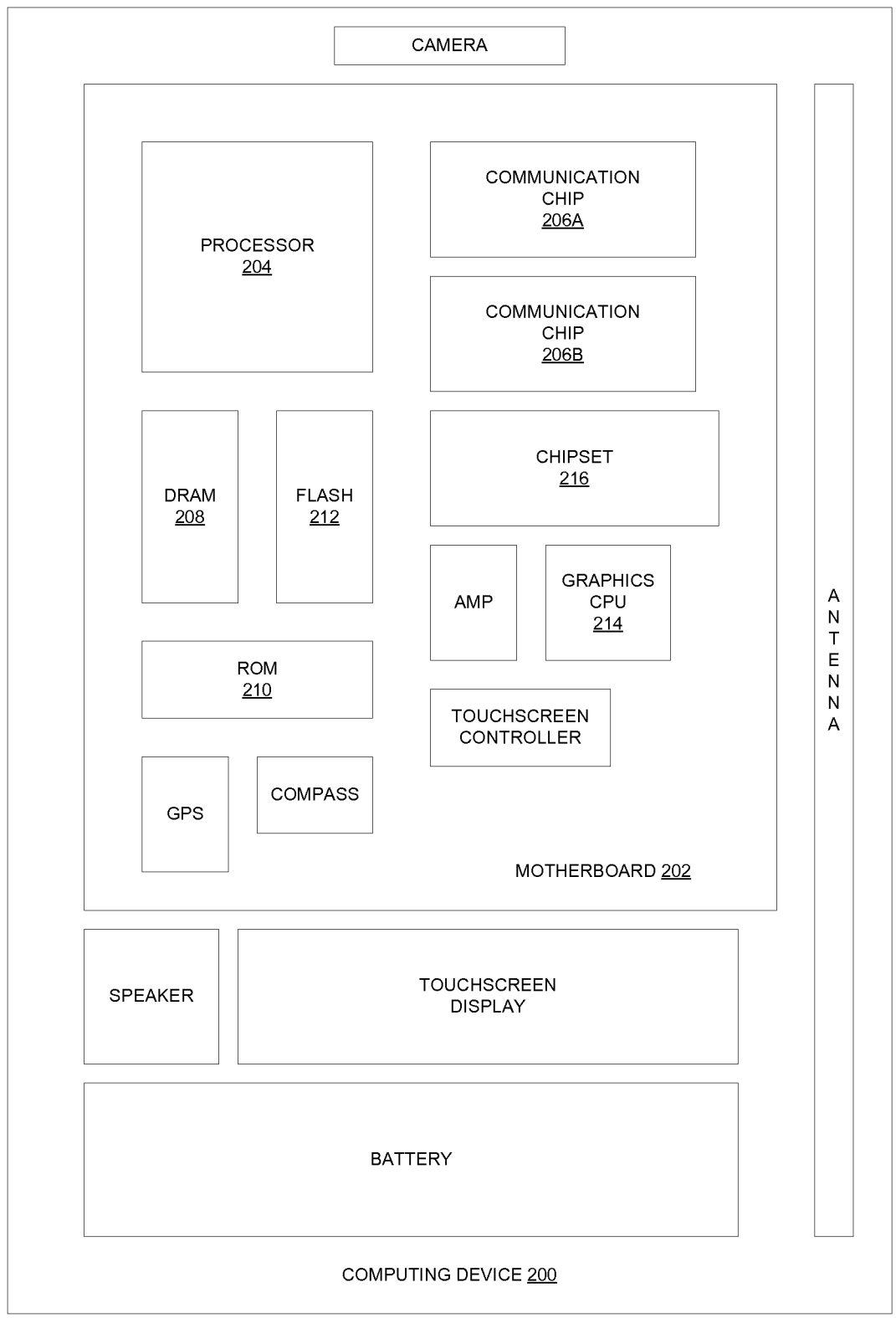
FIG. 11 illustrates a computing device in accordance with one implementation of the present description.

FIG. 11 illustrates a computing device 200 in accordance with one implementation of the present description. The computing device 200 houses a board 202. The board may include a number of microelectronic components, including but not limited to a processor 204, at least one communication chip 206A, 206B, volatile memory 208, (e.g., DRAM), non-volatile memory 210 (e.g., ROM), flash memory 212, a graphics processor or CPU 214, a digital signal processor (not shown), a crypto processor (not shown), a chipset 216, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 202. In some implementations, at least one of the microelectronic components may be a part of the processor 204.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 400 may include a conductive connector, comprising a dielectric material layer over a conductive land, an opening extending through the dielectric material layer to a portion of the conductive land, a barrier liner on sidewalls of the opening and on the conductive land, and a noble metal on the barrier liner, as described herein.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-11. The subject matter may be applied to other microelectronic device and assembly applications, as will be understood by those skilled in the art.

The following examples pertain to further embodiments, wherein Example 1 is a conductive connector, comprising a dielectric material layer over a conductive land, an opening extending through the dielectric material layer to a portion of the conductive land, a barrier liner on sidewalls of the opening and on the conductive land, and a noble metal on the barrier liner.

In Example 2, the subject matter of Example 1 can optionally include the noble metal comprising a material selected from the group consisting of ruthenium, platinum, palladium, rhodium, rhenium, and iridium.

In Example 3, the subject matter of Example 1 can optionally include the noble metal on the barrier liner comprising a conformal noble metal layer on the barrier liner.

In Example 4, the subject matter of Example 3 can optionally include a conductive fill material on the conformal noble metal layer.

In Example 5, the subject matter of Example 4 can optionally include the conductive fill material comprising a material selected from the group consisting of cobalt, ruthenium, platinum, palladium, rhenium, iridium, molybdenum, nickel, silicon, tungsten, silver, and alloys, borides, carbides, silicides, and nitrides thereof.

In Example 6, the subject matter of Example 1 can optionally include the noble metal on the barrier liner filling the opening.

In Example 7, the subject matter of any of Examples 1 to 6 can optionally include the barrier liner comprising a material selected from the group comprising titanium, tantalum, tungsten, and molybdenum, and nitrides thereof.

In Example 8, the subject matter of any of Examples 1 to 6 can optionally include the conductive land comprising a portion of a transistor.

In Example 9, the subject matter of Example 8 can optionally include the portion of the transistor comprising a workfunction metal In Example 10, the subject matter of any of Examples 1 to 6 can optionally include the conductive land comprising a portion of a conductive route.

The following examples pertain to further embodiments, wherein Example 11 is a method of fabricating a conductive connector, comprising forming a dielectric material layer over a conductive land, forming an opening through the dielectric material layer to expose a portion of the conductive land, forming a barrier liner on sidewalls of the opening and on the exposed portion of the conductive land, and depositing a noble metal on the barrier liner.

In Example 12, the subject matter of Example 11 can optionally include depositing the noble metal comprising depositing a material selected from the group consisting of ruthenium, platinum, palladium, rhodium, rhenium, and iridium.

In Example 13, the subject matter of Example 11 can optionally include depositing the noble metal on the barrier liner comprising forming a conformal noble metal layer on the barrier liner.

In Example 14, the subject matter of Example 13 can optionally include depositing a conductive fill material on the conformal noble metal layer.

In Example 15, the subject matter of Example 14 can optionally include depositing the conductive fill material comprising depositing a material selected from the group consisting of cobalt, ruthenium, platinum, palladium, rhenium, iridium, molybdenum, nickel, silicon, tungsten, silver, and alloys, borides, carbides, silicides, and nitrides thereof.

In Example 16, the subject matter of Example 11 can optionally include depositing the noble metal on the barrier liner comprising filling the opening with the noble metal.

In Examples 17, the subject matter of any of Examples 11 to 16 can optionally include forming the barrier liner comprising forming the barrier liner from a material selected from the group comprising titanium, tantalum, tungsten, molybdenum, and nitrides thereof.

In Example 18, the subject matter of any of Examples 11 to 16 can optionally include forming the dielectric material layer over the conductive land comprising forming the dielectric mater layer over the conductive land, wherein the conductive land comprises a portion of a transistor.

In Example 19, the subject matter of Example 18 can optionally include the forming the dielectric material layer over the conductive land comprising forming the dielectric mater layer over the conductive land, wherein the conductive land comprises a portion of a transistor from a workfunction metal In Example 20, the subject matter of any of Examples 11 to 16 can optionally include forming the dielectric material layer over the conductive land comprising forming the dielectric material layer over the conductive land, wherein the conductive land comprises a portion of a transistor the conductive land comprising a portion of a conductive route.

The following examples pertain to further embodiments, wherein Example 21 is an electronic system comprising a board and a microelectronic component attached to the board, wherein at least one of the microelectronic component and the board, include a conductive connector, comprising a dielectric material layer over a conductive land, an opening extending through the dielectric material layer to a portion of the conductive land, a barrier liner on sidewalls of the opening and on the conductive land, and a noble metal on the barrier liner.

In Example 22, the subject matter of Example 21 can optionally include the noble metal comprising a material selected from the group consisting of ruthenium, platinum, palladium, rhodium, rhenium, and iridium.

In Example 23, the subject matter of Example 21 can optionally include the noble metal on the barrier liner comprising a conformal noble metal layer on the barrier liner.

In Example 24, the subject matter of Example 23 can optionally include a conductive fill material on the conformal noble metal layer.

In Example 25, the subject matter of Example 24 can optionally include the conductive fill material comprising a material selected from the group consisting of cobalt, ruthenium, platinum, palladium, rhenium, iridium, molybdenum, nickel, silicon, tungsten, silver, and alloys, borides, carbides, silicides, and nitrides thereof.

In Example 26, the subject matter of Example 21 can optionally include the noble metal on the barrier liner filling the opening.

In Example 27, the subject matter of any of Examples 21 to 26 can optionally include the barrier liner comprising a material selected from the group comprising titanium, tantalum, tungsten, molybdenum, and nitrides thereof.

In Example 28, the subject matter of any of Examples 21 to 26 can optionally include the conductive land comprising a portion of a transistor.

In Example 29, the subject matter of Example 28 can optionally include the portion of the transistor comprising a workfunction metal In Example 30, the subject matter of any of Examples 21 to 26 can optionally include the conductive land comprising a portion of a conductive route.

Having thus described in detail embodiments of the present description, it is understood that the present description defined by the appended claims is not to be limited by particular details set forth in the above description, as many apparent variations thereof arc possible without departing from the spirit or scope thereof.

What is claimed is:

1. A microelectronic device structure, comprising:
   a dielectric material; and
   a conductive connector within the dielectric material, the conductive connector consisting of:
   a metal fill material comprising ruthenium; and
   a second material in contact with the fill material, and in contact with a sidewall of the dielectric material, wherein the second material comprises nitrogen and titanium, tantalum, tungsten, or molybdenum.

2. The microelectronic device structure of claim 1, wherein the ruthenium has a thickness of between 1 A and 1000 A.

3. The microelectronic device structure of claim 1, wherein the conductive connector is in direct contact with an underlying conductive land, and wherein a portion of the second material is between the conductive land and the fill material.

4. The microelectronic device structure of claim 3, wherein the second material is in direct contact with the conductive land.

5. The microelectronic device structure of claim 4, wherein the conductive land comprises a transistor gate electrode.

6. The microelectronic device structure of claim 5, wherein the conductive land comprises titanium.

7. The microelectronic device structure of claim 1, wherein the fill material is a noble metal fill material.

* * * * *